Jan. 23, 1968 D. J. KONEVAL ET AL 3,365,591

PIEZOELECTRIC RESONATOR

Filed April 8, 1966

INVENTORS
DONALD J. KONEVAL
DANIEL R. CURRAN

BY

James A. Smith
ATTORNEY

United States Patent Office 3,365,591
Patented Jan. 23, 1968

3,365,591

PIEZOELECTRIC RESONATOR

Donald J. Koneval, Warrensville Heights, and Daniel R. Curran, Cleveland Heights, Ohio, assignors to Clevite Corporation, a corporation of Ohio Filed Apr. 8, 1966, Ser. No. 541,236
11 Claims. (Cl. 310—8.2)

ABSTRACT OF THE DISCLOSURE

A wafer of piezoelectric material is suitably electroded to define a piezoelectric resonator. A layer of high Q insulating material of predetermined thickness is formed on at least one face surface of the wafer and provided with a peripheral edge region having a configuration which serves to disperse vibratory modes normally reflected by the wafer edge to substantially reduce standing wave patterns and spurious responses. Reference is made to the claims for a legal definition of the invention.

This invention relates to piezoelectric resonators and, specifically, to improved high frequency resonators for use in electric filter circuits.

The invention has utility in connection with piezoelectric resonators comprising a thin wafer of monocrystalline or ceramic material having a vibrational mode producing a particle displacement in the plane of the wafer which is anti-symmetrical about the center plane of the wafer. Such vibrational modes include the thickness shear, thickness twist and torsional modes all of which can be obtained with piezoelectric monocrystalline materials and in piezoelectric ceramic materials.

The typical wafer type of resonator is provided with electrodes of predetermined area on opposite planar surfaces thereof to enable the resonator to be excited electromechanically in its principal vibratory mode. At the resonant condition maximum particle motion and wave motion occurs.

In copending application Ser. No. 281,488 filed on May 20, 1963, by William Shockley and Daniel R. Curran and assigned to the same assignee as the present invention there are disclosed resonator structures in which wave propagation beyond the electroded region is minimized to thereby reduce the "range of action" and maximize the mechanical Q. This is accomplished by structurally establishing a relationship between the resonant frequency $f_a$ of the electroded region and the resonant frequency $f_b$ of the surrounding non-electroded region of the wafer whereby the frequency $f_b$ acts as a cut-off frequency for propagation of the vibratory mode from the electroded region. The relationship is preferably such that $f_a/f_b$ is in the range of 0.8 to .999, i.e., a value less than one, as disclosed in application Ser. No. 281,488. One disclosed method of accomplishing the frequency relationship is to utilize a calculated electrode thickness relative to the thickness of the wafer to effect a predetermined mass loading of the electroded region whereby its resonant frequency is decreased a predetermined amount relative to that of the surrounding wafer material.

Through utilization of the teaching of copending application Ser. No. 281,488 a wafer type resonator can be fabricated having an extremely clean response when $f_a/f_b$ is in the range of 0.8 to 0.99999.

If the required relationship between eletcrode dimensions and the frequency ratio $f_a/f_b$ is maintained, unwanted responses having a frequency less than $f_b$ cannot exist. At frequencies greater than $f_b$, however, mode propagation can occur in the non-electroded region of the wafer and reflections from the wafer edge can set up a system of standing waves in the non-electroded portion of the wafer. The resulting unwanted responses are observed above the cut-off frequency $f_b$, and can degrade resonator performance. While the existence of these modes is dependent upon the boundary conditions at the wafer edge, the magnitude is dependent upon both the diameter to thickness ratio of the wafer and the frequency difference between the unwanted mode and the principle mode $f_a$.

For example, attenuation of the unwanted modes above $f_b$ decreases if the diameter to thickness ratio and/or the frequency difference is decreased. In many cases these factors provide sufficient attenuation, however, it is often necessary or advantageous to eliminate or reduce these unwanted responses by altering the boundary conditions at the wafer edge.

Prior art resonators, e.g., 10 mc.–30 mc. fundamental mode, have heretofore been provided with a particular planar configuration such a triangular configuration, for the purpose of eliminating or reducing unwanted responses. While such configurations are effective to a limited extent, the making and fabrication operations required are complex particularly in the case of VHF quartz wafers and only simple non-circular peripheral configurations can be economically achieved.

It is an object of the present invention to more efficiently reduce the spurious responses of a wafer type resonator.

Another object of the invention is to provide a low cost wafer type resonator having means for substantially reducing spurious responses.

In one preferred embodiment of the invention a wafer of piezoelectric material is suitably electroded to define a piezoelectric resonator. A layer of high Q insulating material of predetermined thickness is formed on at least one face surface of the wafer and provided with a peripheral edge region having a configuration which serves to disperse vibratory modes normally reflected by the wafer edge to substantially reduce standing wave patterns and spurious responses.

Other objects and advantages will become apparent from the following decsription taken in connection with the accompanying drawings wherein.

Figure 1:
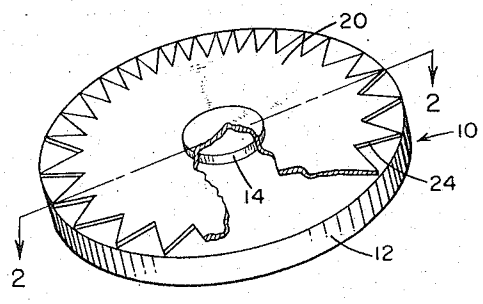
FIGURE 1 is a perspective view of a resonator in accordance with the invention.

Referring to FIGURE 1 of the drawing there is shown a piezoelectric resonator identified generally by the reference numeral 10. In general the resonator 10 comprises a thin wafer (in this case circular) of piezoelectric material 12 having a pair of oppositely disposed electrodes 14 and 16 which coact with the intervening piezoelectric material to define a resonator. Preferably resonator 10 is of the wafer type shown in FIGURE 1 formed from monocrystalline or ceramic material having a vibrational mode producing a particle displacement in the plane of the wafer which is anti-symmetrical about the center plane of the wafer, e.g., thickness shear, thickness twist and torsional modes.

Known monocrystalline piezoelectric materials include quartz, Rochelle salt, DKT (di-potassium tartrate), lithium sulfate or the like. As is well known to those skilled in the crystallographic arts, the basic vibrational mode of a crystal wafer is determined by the orientation of the wafer with respect to the crystallographic axis of the crystal from which it is cut. It is known for example that a "0° Z-cut" of DKT or an "AT-cut" of quartz may be used for a thickness shear mode of vibration.

Of the various monocrystalline piezoelectrics available quartz, primarily because of its stability and high mechanical quality factor $Q_m$ is a preferred material for narrow band filter applications. An "AT-cut" quartz wafer responds in the thickness shear mode to a potential gradient between its major surfaces and is particularly suitable.

For wider band filters the wafers are preferably fabricated of a suitable polarizable ferroelectric ceramic material such as barium titanate, lead zirconate-lead titanate, or various chemical modifications thereof. Suitable ceramic material for the purposes of the invention are ceramic compositions of the type disclosed and claimed in U.S. Patents Nos. 3,006,857 and 3,179,594. Such ferroelectric ceramic compositions may be polarized by methods known to those skilled in the art. For example, a thickness shear mode of vibration may be accomplished through polarization in a direction parallel to the major surfaces of a wafer, in the manner described in U.S. Patent No. 2,646,610 to A. L. W. Williams.

While, as discussed, the inventive concept is equally applicable to monocrystalline or ceramic piezoelectric wafers having a vibrational mode wherein the partial motion is anti-symmetrical with respect to the center plane, the disclosure will be in regard to resonators comprising an "AT-cut" quartz crystal.

In accordance with the teaching of co-pending application Serial No. 281,488 the resonator 10 defines an electroded region which has a resonant frequency $f_a$ less than the resonant frequency $f_b$ of the surrounding region. Preferably the frequencies $f_a$ and $f_b$ are related whereby $f_a/f_b$ is in the range of 0.8 to 0.99999.

Figure 2:
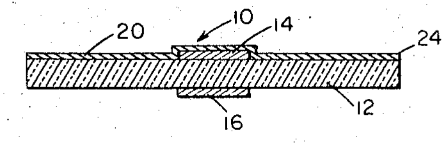
FIGURE 2 is a section taken along the line 2—2 of FIGURE 1.

In accordance with the present invention at least one surface of the wafer 12 is provided with a layer of insulating material 20 having a predetermined thickness on at least one face surface thereof as shown in FIGURE 2. The layer 12 preferably comprises a coating of high Q insulating material such as an oxide of silicon ($SiO$, $SiO_2$ and/or $Si_2O_3$) and is preferably formed by a vapor deposition process using suitable masking techniques. In the embodiment shown the layer 20 covers substantially the entire exposed face surface of the wafer 12 and the electrode 14.

If desired the coating forming layer 20 may be omitted from the electroded region of the wafer. However, since the layer thickness affects the resonant frequency of the areas to which it is applied it is more convenient to apply the coating to both the electroded and non-electroded regions so that the frequencies of both areas are equally decreased by the layer thickness. The thickness of the wafer may be appropriately predetermined so that the desired operating frequency will be achieved upon application of layer 20.

In the case of an inverted mesa type of resonator such as disclosed in copending application Ser. No. 448,923 filed on Apr. 19, 1965 and assigned to the same assignee as the present application, it may be desirable to intentionally omit application of the coating to the electrodes whereby the electrodes will effectively become recessed by the surrounding thickness of layer 20 to form the structure disclosed as one embodiment of said copending application.

Layer 20 in accordance with the invention is provided with an irregular peripheral edge region 24 such as the saw toothed configuration depicted in FIGURE 1. With this configuration the peripheral edge 24 of layer 20 defines a plurality of angularly disposed rectilinear edge segments which tend to disperse vibratory modes which would normally be propagated to the edge of the wafer and reflected back in phase to the electroded region.

The saw toothed edge configuration disclosed in FIGURE 1 has been found to be effective in reducing spurious resonator responses associated with the unelectroded wafer. As will be apparent to those skilled in the art many other irregular edge configurations of the layer 20 are possible and within the scope of the invention. For example the layer 20 may be provided with a conventional star configuration or may be provided with various non-symmetrical or random configurations.

Figure 3:
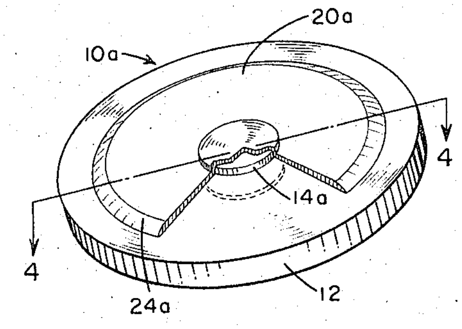
FIGURE 3 is a perspective view of a resonator illustrating another embodiment of the invention.
Figure 4:
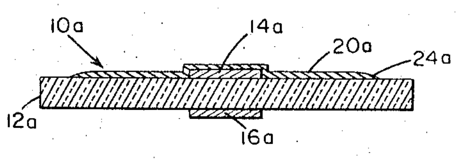
FIGURE 4 is a section taken along the line 4—4 of FIGURE 3.

Referring to FIGURES 3 and 4 of the drawings there is shown another specific embodiment of the layer 20 identified by the reference numeral **20*a*. In this embodiment the peripheral edge 24*a*** is of circular configuration and the edge region is thickness bevelled or tapered as shown most clearly in FIGURE 4. While slightly less efficient, the bevelled or tapered edge region functions in the same manner as the saw toothed edge to effectively prevent the formation of standing wave patterns and spurious responses.

It will be apparent to those skilled in the art that the layer 20 of FIGURES 1 and 2 may be also thickness bevelled or tapered similar to the layer **20*a*** to provide a saw toothed configuration having a tapered or bevelled edge region. Such modifications are within the abilities of one skilled in the art and further description is deemed unnecessary.

In the embodiments shown in FIGURES 1–4 of the drawings the peripheral edge of layer 20 is close to the periphery of the wafer. As a practical matter the periphery of the layer 20 need not be located beyond the range of electromechanical action of the principal mode of the resonator formed by the electrodes and intervening piezoelectric material. The range of action may be determined in accordance with the teaching of U.S. Patent No. 3,222,622 and the aforementioned co-pending application Ser. No. 281,488.

Figure 5:
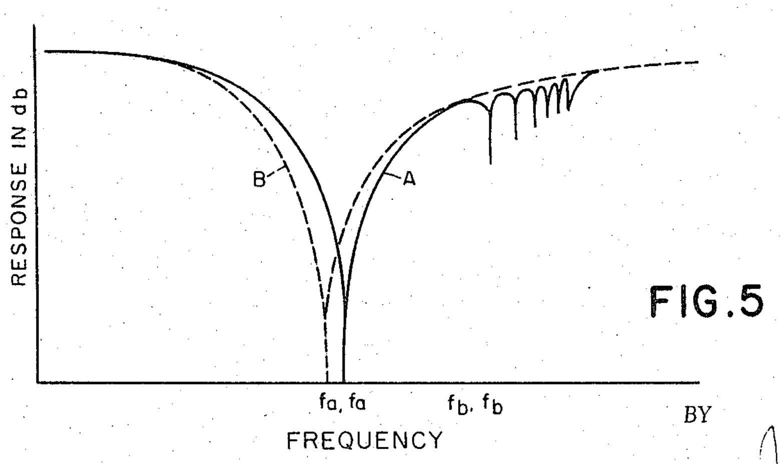
FIGURE 5 is a curve illustrating the operational characteristics of a resonator in accordance with the invention.

Referring now to FIGURE 5 of the drawings there is shown a frequency response curve A for a typical prior art wafer type resonator and a predicted frequency response curve B for such a resonator after application of an insulating layer 20 of the configuration shown in FIGURE 1. It will be noted that curve A exhibits a series of spurious responses at a selected group of frequencies above the cut-off frequency $f_b$ for the resonator. Curve B illustrates definite improvement in over all resonator response.

A comparison of curves A and B also indicates that application of the layer 20 results in a frequency shift of $f_a$ and $f_b$. The layer 20 may accordingly be utilized for tuning the resonator 10 in the same manner as the insulated coatings disclosed and claimed in copending application Ser. No. 449,063 filed on Apr. 19, 1965 and assigned to the same assignee as the present invention. Since the edge configuration and not the thickness of the layer 20 determines primarily the extent of suppression of spurious responses the layer thickness may be varied as desired to provide the desired frequency response characteristics.

It will also be apparent that the invention herein disclosed and claimed may be readily utilized in connection with a multiple resonator structure such as disclosed in U.S. Patent No. 3,222,622. In this case selective tuning and suppression of spurious responses may be accomplished by applying coatings of one of the configurations shown in FIGURES 1–4 to the individual resonator regions. As disclosed in copending application Ser. No. 449,063 the individual coatings may be selectively varied in thickness to accomplish selective tuning of the individual resonators.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

It is claimed and desired to secure by Letters Patent of the United States:

1. A piezoelectric resonator comprising: a thin wafer of piezoelectric material having an electroded region and a surrounding non-electroded region; and a layer of high Q insulating material on at least one surface of said non-electroded region defining a peripheral edge region surrounding said electroded region in spaced relationship therewith; said edge region having a configuration to effectively disperse vibrational modes propagated into said non-electroded region to reduce spurious responses of the resonator.

2. A piezoelectric resonator comprising: a thin wafer of piezoelectric material defining a center plane and having a vibratory mode in which the particle displacement is anti-symmetrical relative to said plane; a pair of electrodes on opposite major surfaces of said wafer; and a layer of high Q insulating material on at least one of said major surfaces covering at least the wafer material immediately surrounding the electrode on said surface; said layer defining a peripheral edge region surrounding said electrode in spaced relationship therewith; said edge region having a configuration for dispersing vibratory modes propagated to said edge region to reduce spurious responses of the resonator.

3. A piezoelectric resonator as claimed in claim 2 wherein said wafer is formed from quartz.

4. A piezoelectric resonator as claimed in claim 2 wherein said wafer is formed from piezoelectric ceramic material.

5. A piezoelectric resonator as claimed in claim 2 wherein said layer comprises vapor deposited dielectric material.

6. A piezoelectric resonator as claimed in claim 2 wherein said layer edge is of saw toothed configuration.

7. A piezoelectric resonator as claimed in claim 2 wherein the edge region of said layer is thickness tapered in the outer extremities thereof.

8. A piezoelectric resonator comprising: a thin wafer of piezoelectric material having a thickness shear mode of vibration; a pair of electrodes positioned on opposite major surfaces of said wafer respectively; said electrodes and the interposed wafer material defining an electroded region having a resonant frequency $f_a$ and the surrounding non-electroded region of the wafer defining a resonant frequency $f_b$; said first and second resonant frequencies being related whereby $f_a/f_b$ is in the range of 0.8 to 0.99999; and a layer of high Q insulating material on at least one of said major surfaces covering at least the wafer material adjacent to and surrounding the electrode on said one major surface; said layer defining an irregular peripheral edge for dispersing harmonic and spurious vibratory modes propagated from said electroded region into said non-electroded region.

9. A piezoelectric resonator as claimed in claim 8 wherein said peripheral edge is of saw toothed configuration.

10. A piezoelectric resonator as claimed in claim 9 wherein said layer comprises a vapor deposited oxide of silicon.

11. A piezoelectric resonator as claimed in claim 10 wherein said wafer is formed from quartz.

References Cited

UNITED STATES PATENTS

| | | | |
|---|---|---|---|
| 2,445,310 | 7/1948 | Chilowsky | 29—25.35 |
| 2,343,059 | 2/1944 | Hight | 310—9.7 |
| 2,159,891 | 5/1939 | Guerbilisky | 310—8.2 |
| 1,848,630 | 3/1932 | Hulburt | 310—8.2 |

MILTON O. HIRSHFIELD, *Primary Examiner.*

J. D. MILLER, *Examiner.*